United States Patent [19]
Rice et al.

[11] Patent Number: 5,495,490
[45] Date of Patent: Feb. 27, 1996

[54] IMMERSION METHOD AND APPARATUS FOR COOLING A SEMICONDUCTOR LASER DEVICE

[75] Inventors: Robert R. Rice, Chesterfield; Joe B. Russek, Fenton, both of Mo.

[73] Assignee: McDonnell Douglas Corporation, St. Louis, Mo.

[21] Appl. No.: 395,795

[22] Filed: Feb. 28, 1995

[51] Int. Cl.$^6$ .......................................................... H01S 3/04
[52] U.S. Cl. .................................. 372/34; 372/36; 372/92; 372/69
[58] Field of Search ................................ 372/34, 36, 92, 372/69, 70, 75

[56] References Cited

U.S. PATENT DOCUMENTS

| | | | |
|---|---|---|---|
| 4,315,225 | 2/1982 | Allen et al. | 372/35 |
| 4,719,631 | 1/1988 | Conaway | 372/34 |
| 4,791,634 | 12/1988 | Miyake | 372/35 |
| 5,105,429 | 4/1992 | Mundinger et al. | 372/35 |
| 5,105,430 | 4/1992 | Mundinger et al. | 372/35 |
| 5,309,457 | 5/1994 | Minch | 372/35 |
| 5,353,293 | 10/1994 | Shull | 372/35 |

*Primary Examiner*—Leon Scott, Jr.
*Attorney, Agent, or Firm*—Bell, Seltzer, Park & Gibson

[57] ABSTRACT

An immersion cooled semiconductor laser assembly includes an electrically activated semiconductor laser device, such as a two-dimensional laser diode array, and liquid coolant flowing thereabout which directly contacts the emitting facet of the semiconductor laser device. The semiconductor laser assembly also includes first and second electrodes for supplying electrical energy to the semiconductor laser device such that the semiconductor laser device emits a laser output through its emitting facet. During the emission of the laser output, however, the semiconductor laser device generates heat, thereby increasing the temperature of the semiconductor laser device. In order to protect the semiconductor laser device, the circulating liquid coolant draws heat from the semiconductor laser device, thereby cooling the semiconductor laser device. The liquid coolant can be a dielectric liquid coolant which is both electrically and optically passive so a to maintain electrical isolation between the first and second electrodes without absorbing the laser output of the semiconductor laser device. By efficiently cooling the semiconductor laser device, the semiconductor laser device can consistently product output pulses having a relatively high average power and a relatively high pulse repetition rate.

31 Claims, 2 Drawing Sheets

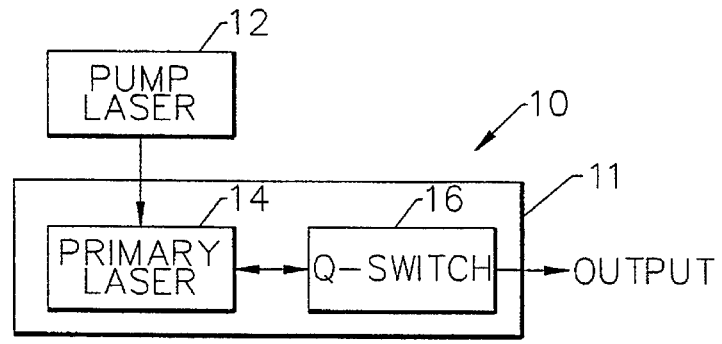
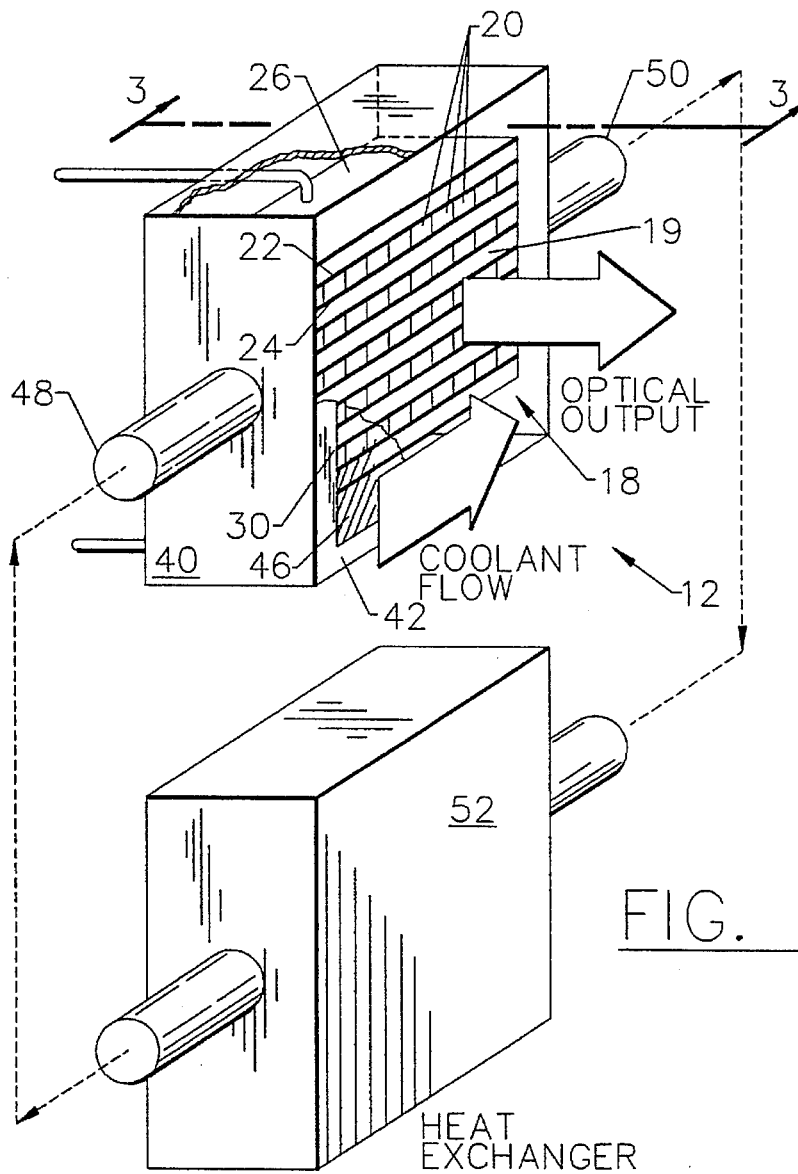

IMMERSION METHOD AND APPARATUS FOR COOLING A SEMICONDUCTOR LASER DEVICE

FIELD OF THE INVENTION

The present invention relates generally to semiconductor laser devices and, more particularly, to methods and apparatus for cooling semiconductor laser devices.

BACKGROUND OF THE INVENTION

A number of lasers, such as slab and rod lasers, are designed to produce output pulses having a high average output power, such as 1,000–10,000 W for a 100–1000 KHz diode pumped Nd:YAG slab laser. High levels of output power are required in a number of applications including laser radar, mine detection, welding, material processing, surface coating, isotope separation and x-ray lithography, among others. In order to obtain such high power levels, a primary laser, such as a slab or a rod laser, can be pumped by a laser pump source, such as an array of semiconductor laser diodes. The laser pump source must also operate at relatively high power levels and either at relatively high pulse repetition rates or continuously in order to generate the necessary power to excite the primary laser.

In generating pulses having a relatively high average output power and a relatively high repetition rate, the laser pump source generates a significant amount of heat which elevates the temperature of the laser pump source in the absence of external cooling. The amount of heat generated by conventional lasers is relatively large. For example, the heat generated by a laser can be approximated by the difference between the power input to the laser and the output power received from the laser. Typically, the heat generated by a conventional laser is approximately 50%–60% of the input power.

Lasers, such as semiconductor laser diode arrays, however, typically have a maximum operating temperature above which the operation of the laser can be unreliable. In addition, operation of a laser, such as a semiconductor laser diode array, at an elevated temperature generally reduces the effective lifetime of the laser even though such temperatures may be below the maximum operating temperature. For example, operation of a semiconductor laser diode array at an elevated temperature can damage the emitting facet of the laser diode array, thereby impairing its performance.

Consequently, a number of techniques have been developed to cool lasers and, in particular, to cool semiconductor lasers, such as semiconductor lasers which pump a primary laser. For example, semiconductor pump lasers generally include a plurality of linear arrays of laser diodes which are arranged in a two-dimensional laser diode array. One conventional technique for cooling semiconductor pump lasers is back plane cooling. As known by those skilled in the art, back plane cooling is typically provided by a heatsink which is in thermal contact with the semiconductor pump laser and which draws heat from the semiconductor pump laser. The heatsink is also preferably electrically conductive to provide electrical continuity between the plurality of linear laser diode arrays of the semiconductor pump laser. For example, the heatsink can be fabricated from copper which is electrically conductive and which has a relatively low thermal impedance.

In order to improve its heat dissipation, the heatsink generally includes a plurality of microchannels defined therein which are adapted to carry fluid, such as water. The fluid absorbs heat from the heatsink and, in turn, from the semiconductor pump laser, thereby cooling the semiconductor pump laser. Typically, the microchannels defined in the heatsink are in fluid communication with an external cooler or chiller, such as a radiator or other type of heat exchanger. The external cooler removes heat from the circulating fluid to thereby reduce the temperature of the fluid. Accordingly, the fluid can be recirculated to further cool the semiconductor pump laser.

Back plane cooling suffers from several deficiencies, however, including the necessity for a secure and thermally conductive attachment between the heatsink and the semiconductor pump laser. For example, thermal inefficiencies are incurred in the conduction of heat from the plurality of laser diode junctions of a semiconductor laser array at which the heat is generated to the heatsink. Further, the fluid flow must be strictly confined within the microchannels since the semiconductor pump laser diode is typically electrically activated.

Thus, in order to reduce the chances of an electrical fault or a short circuit, heatsinks comprised of materials which are both electrically insulating and thermally conductive, such as Beryllium Oxide (BeO), have been employed. Since BeO is electrically insulating, however, the surfaces of the BeO heatsinks must generally be patterned in metal in order to provide sufficient electrical continuity between the plurality of stacked linear laser diode arrays which form the two-dimensional laser diode array. The metal pattern formed on the BeO heatsinks produces a parasitic series resistance which, although relatively small, is significantly larger than the resistance of a comparable copper heatsink. In addition, a BeO heatsink conducts heat much less efficiently than a copper heatsink having comparable dimensions. Thus, heatsinks formed of insulating materials, such as BeO, generally suffer from reductions in both their thermal performance and their electrical efficiency in comparison with comparable copper heatsinks.

Another technique for providing back plane cooling of a semiconductor pump laser includes a silicon carrier having a front surface to which the semiconductor pump laser is bonded. The front surface of the silicon carrier can include turning mirrors, integrally fabricated thereon, to reflect laser light emitted by the semiconductor pump laser upward and away from the surface of the silicon carrier. The silicon carrier can also include an integral microchannel structure defined on a rear surface, opposite the front surface. As described above, the microchannel structure is adapted to carry fluid, such as water, which cools the silicon carrier and, in turn, cools the semiconductor pump array.

In order to provide sufficient electrical continuity between the semiconductor pump laser and the silicon carrier, however, the upper surface of the silicon carrier must generally either be metalized or doped to degeneracy. As described above, this metallization or degenerative doping, while providing electrical continuity between the plurality of linear laser diode arrays, increases the parasitic series resistance of the silicon carrier as compared to a copper heatsink of comparable dimensions. In addition, a silicon carrier generally has a lower thermal conductivity than a comparable copper heatsink.

SUMMARY OF THE INVENTION

It is therefore an object of the present invention to provide an improved method and apparatus for cooling a semiconductor laser device.

It is a more specific object of the present invention to provide an improved method and apparatus for cooling the emitting facets of a semiconductor laser device.

It is yet another object of the present invention to provide an improved method and apparatus for increasing the heat transfer efficiency from a semiconductor laser device.

These and other objects are provided, according to the present invention, by an immersion cooled semiconductor laser assembly and related method including an electrically activated semiconductor laser device for emitting a laser output in response to a predetermined electrical signal, and a dielectric liquid coolant flowing about the semiconductor laser device such that the dielectric liquid coolant directly contacts and cools the semiconductor laser device and associated electrodes. In operation, the semiconductor laser device generates heat during the emission of the laser output, thereby increasing the temperature of the semiconductor laser device. The dielectric liquid coolant preferably has a temperature less than the temperature of the semiconductor laser device during the emission of the laser output, however, such that the circulation of dielectric coolant about the semiconductor laser device cools the laser device and the associated electrodes.

The immersion cooled semiconductor laser assembly of the present invention also generally includes first and second electrodes for supplying electrical energy to the semiconductor laser device such that the semiconductor laser device emits a laser output through an emitting or front facet thereof. In order to maintain electrical isolation between the first and second electrodes, the coolant is preferably a dielectric liquid which is both electrically and optically passive. In one embodiment, the dielectric liquid coolant is selected from a group consisting of fluorinert compounds, light hydrocarbon compounds, freon, anhydrous ammonia and silicon-based liquids.

The semiconductor laser assembly can also include a housing in which the semiconductor laser device and the first and second electrodes are disposed. The housing has a front surface defining an opening therein. In one embodiment, a window is disposed within the opening defined in the front surface of the housing. The semiconductor laser device is preferably disposed within the housing such that the emitting facet of the semiconductor laser device is positioned adjacent the window in a predetermined spaced apart relationship. Accordingly, liquid coolant can circulate between the window, the semiconductor laser device and the electrodes, thereby cooling the semiconductor laser device.

In another embodiment, a solid state laser is disposed within the opening defined in the front surface of the housing. In this embodiment, the semiconductor laser device is again disposed within the housing such that the emitting facet of the semiconductor laser device is positioned adjacent the solid state laser in a predetermined spaced apart and aligned relationship, so that the semiconductor laser device pumps the solid state laser. Thus, the circulating liquid coolant can cool both the solid state laser and the semiconductor laser device.

In either embodiment, the housing can include an inlet port and an outlet port through which the liquid coolant flows. In addition, the immersion cooled semiconductor laser assembly can include coolant directing means for directing the flow of liquid coolant in a direction perpendicular to the emitting facet of the semiconductor laser device.

According to one advantageous embodiment, the semiconductor laser device can include a two-dimensional laser diode array. The two-dimensional laser diode array includes a plurality of stacked linear laser diode arrays, each of which has first and second opposed major surfaces. To form the two-dimensional laser diode array, the plurality of linear laser diode arrays are preferably stacked such that the first major surface of a first linear laser diode array faces the second major surface of a second linear laser diode array.

The immersion cooled laser diode array of this embodiment can also include a plurality of heatsinks disposed between and electrically connecting each adjacent pair of linear laser diode arrays. More particularly, each heatsink is preferably positioned between the first major surface of a first linear laser diode array and the second major surface of a second linear laser diode array so as to be in thermal contact with both adjacent laser diode arrays. The heatsinks extend rearwardly from the laser diode array to define a plurality of channels between the rearwardly extending heatsinks. More specifically, each heatsink generally extends from a first end between a pair of adjacent linear laser diode arrays rearwardly to an opposed second end. The channels are adapted to receive liquid coolant such that the liquid coolant directly contacts and cools the linear laser diode arrays, while maintaining electrical isolation between the first and second electrodes.

The immersion cooled laser diode array can also include a plurality of electrically insulating spacers. At least one spacer is disposed between the respective second ends of each pair of adjacent heat sinks to further define the channel. In particular, the channel of this embodiment is defined between a pair of adjacent heatsinks, an electrically insulating spacer and a linear laser diode array.

According to the present invention, the direct contact of the liquid coolant with the semiconductor laser device and, in particular, with the emitting facet of the semiconductor laser device decreases the thermal impedance of the semiconductor laser assembly and, consequently, provides improved cooling. The decreased thermal impedance is particularly effective for removing heat from laser pump sources which produce output pulses having a relatively high average power and a relatively high repetition rate. In addition, the dielectric liquid coolant which circulates through the semiconductor laser device is preferably both electrically and optically passive such that the electrodes which supply electrical energy to the semiconductor laser device remain electrically isolated.

BRIEF DESCRIPTION OF THE DRAWINGS

FIG. 1 is a block diagram of a laser system according to the present invention which illustrates the relationship of a laser pump source, a primary laser and a Q-switch.

FIG. 2 is a perspective view of a semiconductor laser device according to the present invention with portions of the housing and window removed to illustrate internal components thereof.

DETAILED DESCRIPTION OF THE PREFERRED EMBODIMENTS

Figure 3:
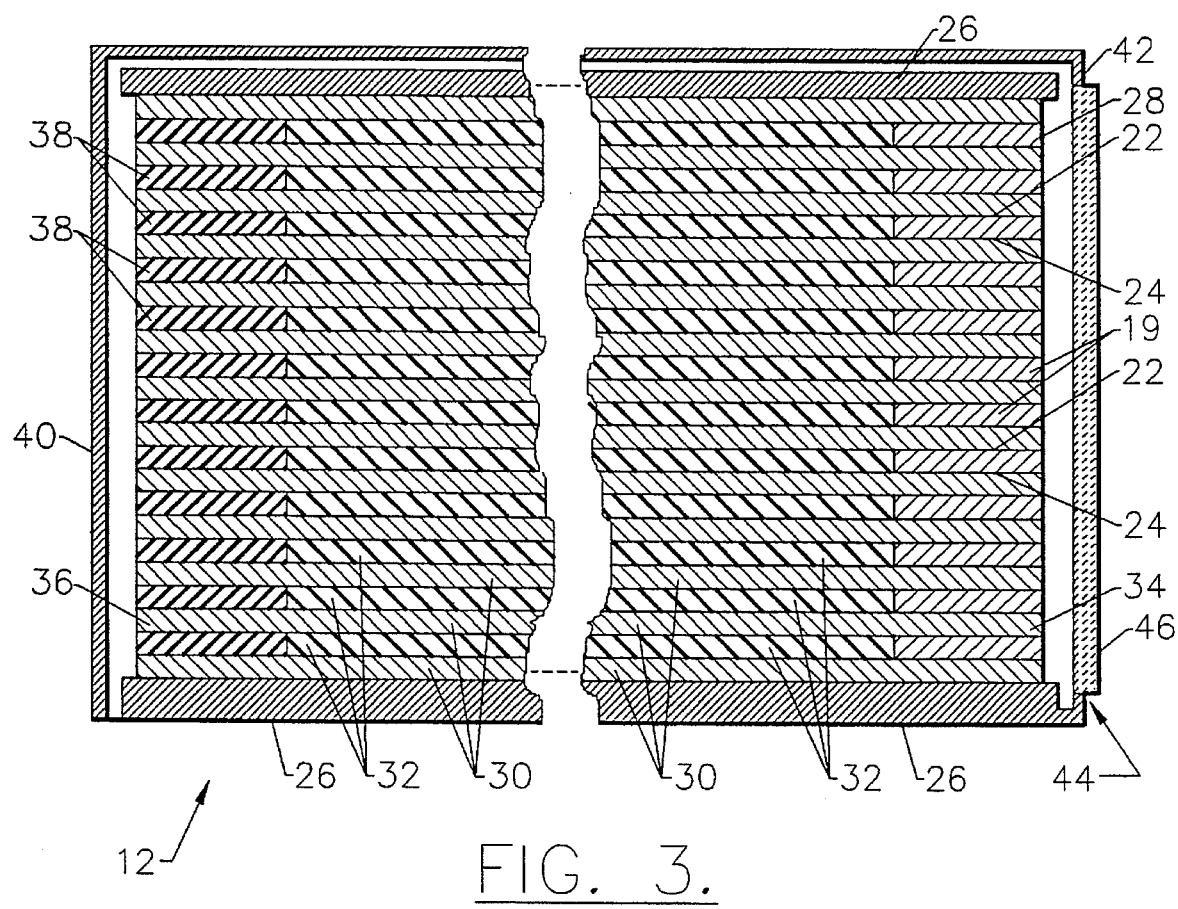
FIG. 3 is a cross-sectional view of the semiconductor laser device of FIG. 2 taken along line 3—3.

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Referring now to FIG. 1, a laser system 10 which is adapted to provide a laser output having a relatively high output power level is illustrated in block diagram form. In particular, the laser system includes a laser pump source 12 for emitting laser output pulses. The output pulses are preferably produced at a relatively high repetition rate and have a relatively high average power level. For example, the laser pump source can be a two-dimensional laser diode array which produces pulses having an average power level of 100–1000 W/cm$^2$ at an average repetition rate of 100–1000 Hz.

The output pulses emitted by the laser pump source 12 are applied to a primary laser 14, such as a slab or rod laser. For example, the primary laser can be a Nd:YAG slab laser. The output of the primary laser can, in turn, be controlled by a Q-switch 16. As known to those skilled in the art, the Q-switch induces the primary laser to emit short pulses with high peak power as shown in FIG. 1. Alternatively, in embodiments in which the laser system 10 does not include a Q-switch, the primary laser will generally operate in either a continuous wave (CW) or a long pulse mode. If included, the Q-switch defines, at least in part, the primary laser cavity 11 and controls the output of the primary laser such that only output pulses having a power level above a predetermined threshold level are generated. For example, a Q-switched Nd:YAG laser generally produces output pulses having an average power level of 10 W to more than 1000 W at an average pulse repetition rate of 1000 Hz or greater.

According to the present invention, the laser pump source 12 is a semiconductor laser assembly including a semiconductor laser device 18. In one preferred embodiment, the semiconductor laser device includes a linear array of laser diodes 19 and, more preferably, includes a plurality of linear arrays of laser diodes configured as a two-dimensional laser diode array. For example, one embodiment of the semiconductor laser device of the present invention which includes a two-dimensional laser diode array is illustrated in FIGS. 2 and 3. As known to those skilled in the art, the individual laser diodes or emitters 20 of the semiconductor laser device are preferably electrically connected such that the output of the laser diode array is synchronized. In addition, it will be apparent to one skilled in the art that the lines of FIG. 2 which separate the individual emitters are for purposes of illustration and form no material portion of the known laser diode array.

The plurality of linear laser diode arrays 19 which comprise the semiconductor laser device 18 can be fabricated of any of the semiconducting materials known to those skilled in the art. For example, the plurality of linear laser diodes can be comprised of AlGuAs, InGaAs, or GaInAsP. The plurality of linear laser diodes can be comprised of other materials known to those skilled in the art, however, without departing from the spirit and scope of the present invention. In addition, each linear laser diode array can include a plurality of individual emitters 20, such as between sixteen and thirty emitters in one exemplary embodiment.

The plurality of linear laser diode arrays 19 are generally stacked to form the two-dimensional laser diode array. In particular, each linear laser diode array preferably has first and second opposed major surfaces 22 and 24, respectively. As shown in FIGS. 2 and 3, the linear laser diode arrays are preferably stacked such that the first major surface of a first linear laser diode array faces the second major surface of a second linear laser diode array to thereby create the two-dimensional laser diode array. While a two-dimensional laser diode array is illustrated and described herein, the immersion cooling method and apparatus can effectively cool other types of semiconductor laser devices, such as surface emitting laser diode arrays.

As also illustrated in FIGS. 2 and 3, the semiconductor laser device 18 of the present invention is electrically activated. Thus, the semiconductor laser device preferably includes first and second electrodes 26, electrically connected to the semiconductor laser device, for supplying electrical energy to the semiconductor laser device. Upon sufficient electrical actuation, the semiconductor laser device emits a laser output through an emitting or front facet 28 of the semiconductor laser device and, more particularly, through the respective emitting or front facets of the individual laser diodes Typically, the laser output is a series of pulses having a relatively high repetition rate, though CW operation may also be desirable.

During the emission of the laser output, the semiconductor laser device 18 generates heat which increases the temperature of the semiconductor laser device in the absence of cooling. In order to maintain the semiconductor laser device at a temperature safely below a predetermined maximum operating temperature and, consequently, to prevent damage to the laser device, the semiconductor laser device is cooled.

According to the present invention, liquid coolant circulates about the electrically activated semiconductor laser device 18. More preferably, the liquid coolant flows about and directly contacts the emitting facet 28 of the semiconductor laser device. The liquid coolant has a temperature less than the temperature of the semiconductor laser device during the emission of the laser output. Accordingly, the circulation of liquid coolant about the semiconductor laser device draws heat from and, consequently, cools the laser device.

The liquid coolant is preferably a dielectric liquid which is both electrically and optically passive. Accordingly, the liquid coolant is transparent at the predetermined range of wavelengths at which the semiconductor laser device 18 emits a laser output. In addition, the liquid coolant does not absorb the laser emissions within the predetermined range of wavelengths such that the output power level produced by the semiconductor laser device is not attenuated or diminished by the circulating liquid coolant. In one embodiment, the dielectric liquid coolant is a fluorinert compound, such as FC75 or FC77. In another embodiment, the dielectric liquid coolant is a light hydrocarbon compound, such as hexane. In yet another embodiment, the dielectric liquid coolant is freon, anhydrous ammonia or a silicon-based liquid.

By directly contacting the semiconductor laser device 18 and, more particularly, by directly contacting the emitting facet 28 of the semiconductor laser device, the thermal impedance of the semiconductor laser assembly 12 is reduced. In addition, the direct contact of the liquid coolant with the emitting facets of the individual laser diodes 20 of the semiconductor laser device provides for increased or enhanced cooling of the emitting facets such that the semiconductor laser device can be operated at relatively high temperatures without damaging the emitting facets of the laser diodes. Accordingly, the operating lifetime of the semiconductor laser device is prolonged. Further, the immersion of the semiconductor laser device and, in particular, the immersion of the emitting facet of the semiconductor laser device in the liquid coolant significantly reduces the risk that the emitting facet of the semiconductor laser device is exposed to external contamination.

As illustrated in FIG. 2, an immersion cooled semiconductor laser assembly can also include a plurality of heatsinks 30. Typically, the heatsinks are comprised of a material having relatively high thermal conductivity. In addition, the heatsinks are preferably electrically conductive so as to electrically connect the plurality of linear laser diode arrays 19. Thus, the plurality of heatsinks can be comprised of copper or copper alloys, gold, silver or other known materials which are both electrically and thermally conductive.

As shown in more detail in FIG. 3, at least one heatsink 30 is disposed between and electrically connected to each adjacent pair of the plurality of linear laser diode arrays 19. The plurality of heatsinks extend rearwardly from the two-dimensional laser diode array to define a plurality of channels 32 between the rearwardly extending heatsinks. In the embodiment illustrated in FIG. 3, each heatsink extends from a first end 34 between a pair of adjacent linear laser diode arrays rearwardly to an opposed second end 36.

The immersion cooled semiconductor laser assembly 12 can also include a plurality of electrically insulating spacers 38, typically comprised of an insulating material, such as Beryllium Oxide (BeO) or a plastic material. At least one spacer is disposed between the respective second ends 36 of each pair of adjacent heatsinks 30 to further define the channel 32. In particular, each channel of this embodiment is defined between a pair of adjacent heatsinks, an electrically insulating spacer disposed between the adjacent pair of heatsinks and a linear laser diode array 19 also disposed between the adjacent pair of heatsinks.

In operation, liquid coolant flows through the plurality of channels 32 defined by the rearwardly extending heatsinks 30 to contact and cool the plurality of linear laser diode arrays 19 by drawing heat from the heatsinks. Since the coolant is a dielectric liquid, however, the coolant maintains the electrical isolation between the first and second electrodes 26.

The semiconductor laser assembly 12 of the present invention also preferably includes a housing 40 in which the semiconductor laser device 18, the first and second electrodes 26, the plurality of heatsinks 30 and the plurality of electrically insulating spacers 38 are disposed. As shown in a partial fragmentary perspective view in FIG. 2 and in cross-section in FIG. 3, the housing has a front surface 42 defining an opening 44 therein. The laser output of the semiconductor laser device is preferably emitted through the opening defined in the first surface of the housing. According to a first embodiment, a window 46 is disposed in the opening in the front surface of the housing. Preferably, the window is comprised of material which is transparent to the laser output within the range of wavelengths which the semiconductor laser device emits. For example, the window can be comprised of glass, fused silicon, or sapphire. However, the window can be comprised of other materials without departing from the spirit and scope of the present invention.

The semiconductor laser device 18 is preferably disposed within the housing 40 such that the emitting facet 28 of the semiconductor laser device is positioned adjacent the window 46 in a predetermined spaced apart relationship. As best shown in cross-section in FIG. 3, liquid coolant circulates between the window and the semiconductor laser device, through the heatsink 30, and, in addition, between the window and the emitting facets of the individual laser diodes 20 of the semiconductor laser device to thereby draw heat from and cool the semiconductor laser device.

In a second embodiment, the primary laser 14, such as a solid state laser, is disposed within the opening 44 defined in the front surface 42 of the housing 40. As described above, the semiconductor laser device 18 is disposed within the housing such that the emitting facet 28 of the laser device is positioned adjacent to the solid state laser in a spaced apart and aligned relationship. Thus, the semiconductor laser device pumps the solid state laser. In addition, the liquid coolant circulates between the solid state laser and the semiconductor laser device to thereby draw heat from and cool both the solid state laser and the semiconductor laser device.

As illustrated in FIG. 2, the housing 40 also preferably includes an inlet port 48 and an outlet port 50 through which the liquid coolant flows. As also illustrated schematically in FIG. 2, the semiconductor laser assembly can include a heat exchange means, such as an external cooler or chiller 52. For example, the external cooler can be a radiator or other type of heat exchanger. In one embodiment, the external cooler is self-sustaining, that is, the external cooler supports fluid flow in only one direction. The external cooler of this embodiment generally includes a series of valves which only permit fluid flow in the one predetermined direction.

In operation, the liquid coolant enters the semiconductor laser assembly 12 through the inlet port 48 defined in the housing 40, flows through a channel 32 defined between a pair of adjacent heatsinks 30, and exits from the housing through an outlet port 50 defined in an opposed sidewall of the housing. While circulating through the channel defined between an adjacent pair of heatsinks, the liquid coolant absorbs heat or energy from the semiconductor laser device 18 and the heatsinks 30, thereby cooling the semiconductor laser device. By absorbing heat from the semiconductor laser device, however, the temperature of the liquid coolant increases. Thus, upon exiting the housing through the outlet port, the liquid coolant preferably flows through the radiator or heat exchanger. Within the heat exchanger, liquid coolant discharges at least a portion of the heat which it absorbed from the semiconductor laser device such that the resulting temperature of the liquid coolant decreases.

The inlet and outlet ports 48 and 50 of the illustrated embodiment are defined in the opposed sidewalls of the housing 40. However, the inlet and outlet ports can, instead, be defined through other walls of the housing without departing from the spirit and scope of the present invention. For example, in one embodiment, the semiconductor laser assembly 12 also includes coolant directing means for directing the flow of the liquid coolant in a direction perpendicular to the emitting facet 28 of the semiconductor laser device 18. In this embodiment, the electrically insulating spacers 38 define fluid passageways therethrough such that liquid coolant introduced through an inlet port defined in a rear surface of the housing flows through the fluid passageway of a respective electrically insulating spacer and into a corresponding channel 32 defined between adjacent heatsinks 30. By directing the flow of liquid coolant in a direction perpendicular to the emitting facet of the semiconductor laser device and, more particularly, perpendicular to the emitting facets of the laterally extending linear laser diode array 18, the temperature or energy level of the liquid coolant which contacts each individual laser diode 20 of the linear array is the same, regardless of the lateral position of the respective laser diode. Thus, each individual laser diode can be cooled equally.

In addition, the heat transfer from the heatsinks 30 of the semiconductor laser assembly 12 of the present invention to the liquid coolant flowing thereby can be further modified by controlling the type of coolant flow. For example, a highly turbulent or a relatively laminar smooth coolant flow can be created through the channels 32. In addition, the heat transfer can be further modified by controlling the length of the channel, that is, the distance between the rear surface of the semiconductor laser device 18 and the electrically insulating spacers 38. Thus, for a short channel, i.e., a channel having a length less than about 1–2 mm, in which liquid coolant circulates according to a laminar flow, the heat transfer depends more directly upon the thermal conductivity of the liquid coolant. However, for a long channel, i.e., a channel having a length greater than about 10 mm, in which liquid coolant circulates according to a laminar flow, the heat transfer depends more directly on the thickness of the heatsink and the thermal conductivity of the heatsink, and less directly upon the thermal conductivity of the liquid coolant.

Alternatively, a turbulent flow can be created within the respective channels 32. A turbulent flow creates a greater dependence of the heat transfer on the density and flow velocity of the liquid coolant, and less dependence on the thermal conductivity of the liquid coolant. Thus, relatively dense coolants which circulate rapidly in a turbulent manner will provide increased heat transfer.

According to the present invention, the direct contact of the liquid coolant with the emitting facets 28 of the laser diodes 20 of the semiconductor laser device 18 more efficiently cools the semiconductor laser device. The more efficient cooling is particularly effective for removing heat from laser diode pump arrays which produce output pulses having a relatively high average power and a relatively high repetition rate. In addition, the dielectric liquid coolant is preferably both electrically and optically passive to maintain electrical isolation between the electrodes 26 which supply electrical energy to the semiconductor laser device without absorbing the laser output emitted by the semiconductor laser device.

In the drawings and the specification, there has been set forth a preferred embodiment of the invention and, although specific terms are employed, the terms are used in a generic and descriptive sense only and not for purpose of limitation, the scope of the invention being set forth in the following claims.

What is claimed is:

1. An immersion cooled semiconductor laser assembly comprising:
    an electrically activated semiconductor laser device;
    first and second electrodes, electrically connected to said semiconductor laser device, for supplying electrical energy to said semiconductor laser device such that said semiconductor laser device emits a laser output through an emitting facet thereof, wherein said semiconductor laser device generates heat during the emission of the laser output so as to thereby increase the temperature of said semiconductor laser device; and
    liquid coolant flowing about said electrically activated semiconductor laser device such that said liquid coolant directly contacts the emitting facet of said semiconductor laser device, said liquid coolant having a temperature less than the temperature of said semiconductor laser device during the emission of the laser output such that the flow of said liquid coolant about said semiconductor laser device cools said semiconductor laser device while maintaining electrical isolation between said first and second electrodes.

2. An immersion cooled semiconductor laser assembly according to claim 1 further comprising:
    a housing in which said semiconductor laser device and said first and second electrodes are disposed, said housing having a front surface defining an opening therein; and
    a window disposed within the opening defined in the front surface of said housing, said semiconductor laser device being disposed within said housing such that the emitting facet of said semiconductor laser device is positioned adjacent said window in a predetermined spaced apart relationship such that liquid coolant flows between said window and said semiconductor laser device to thereby cool said semiconductor laser device.

3. An immersion cooled semiconductor laser assembly according to claim 2 wherein said housing further defines an inlet port and an outlet port through which liquid coolant flows.

4. An immersion cooled semiconductor laser assembly according to claim 3 further comprising heat exchanger means, connected between the outlet port and the inlet port of said housing, for discharging heat from the liquid coolant.

5. An immersion cooled semiconductor laser assembly according to claim 1 further comprising coolant directing means for directing the flow of liquid coolant along a direction perpendicular to the emitting facet of the semiconductor laser device.

6. An immersion cooled semiconductor laser assembly according to claim 1 further comprising:
    a housing in which said semiconductor laser device and said first and second electrodes are disposed, said housing having a front surface defining an opening therein; and
    a solid state laser disposed within the opening defined in the front surface of said housing, said semiconductor laser device being disposed within said housing such that the emitting facet of said semiconductor laser device is positioned adjacent said solid state laser in a predetermined spaced apart and aligned relationship such that said semiconductor laser device pumps said solid state laser and such that liquid coolant flows between said solid state laser and said semiconductor laser device to thereby cool both said solid state laser and said semiconductor laser device.

7. An immersion cooled semiconductor laser assembly according to claim 1 wherein said liquid coolant is a dielectric liquid coolant which is both electrically and optically passive.

8. An immersion cooled semiconductor laser assembly according to claim 7 wherein said dielectric liquid coolant is selected from the group consisting of fluorinert compounds, light hydrocarbon compounds, freon, anhydrous ammonia and silicon-based liquids.

9. An immersion cooled semiconductor laser assembly comprising:
    an electrically activated semiconductor laser device for emitting a laser output in response to a predetermined electrical signal, said semiconductor laser device generating heat during the emission of the laser output so as to thereby increase the temperature of said semiconductor laser device; and
    a dielectric liquid coolant flowing about said semiconductor laser device such that said dielectric liquid coolant directly contacts said semiconductor laser device, said dielectric liquid coolant having a temperature less than the temperature of said semiconductor laser device during the emission of the laser output such that the flow of said dielectric liquid coolant about said semiconductor laser device cools said semiconductor laser device, said dielectric liquid coolant being both electrically and optically passive.

10. An immersion cooled semiconductor laser assembly according to claim 9 wherein said dielectric liquid coolant is selected from the group consisting of fluorinert compounds, light hydrocarbon compounds, freon, anhydrous ammonia and silicon-based liquids.

11. An immersion cooled semiconductor laser assembly according to claim 9 further comprising:

a housing in which said semiconductor laser device and said first and second electrodes are disposed, said housing having a front surface defining an opening therein; and a window disposed within the opening defined in the front surface of said housing, said semiconductor laser device being disposed within said housing such that the emitting facet of said semiconductor laser device is positioned adjacent said window in a predetermined spaced apart relationship such that said liquid coolant flows between said window and said semiconductor laser device to thereby cool said semiconductor laser device.

12. An immersion cooled semiconductor laser assembly according to claim 10 wherein said housing further defines an inlet port and an outlet port through which said liquid coolant flows.

13. An immersion cooled semiconductor laser assembly according to claim 12 further comprising heat exchanger means, connected between said outlet port and said inlet port of said housing, for discharging heat from the liquid coolant.

14. An immersion cooled semiconductor laser assembly according to claim 9 further comprising coolant directing means for directing the flow of said liquid coolant along a direction perpendicular to the emitting facet of the semiconductor laser device.

15. An immersion cooled semiconductor laser assembly according to claim 9 further comprising:

a housing in which said semiconductor laser device and said first and second electrodes are disposed, said housing having a front surface defining an opening therein; and a solid state laser disposed within the opening defined in the front surface of said housing, said semiconductor laser device being disposed within said housing such that the emitting facet of said semiconductor laser device is positioned adjacent said solid state laser in a predetermined spaced apart and aligned relationship such that said semiconductor laser device pumps said solid state laser and such that said liquid coolant flows between said solid state laser and said semiconductor laser device to thereby cool both said solid state laser and said semiconductor laser device.

16. An immersion cooled laser diode array comprising:

a two-dimensional laser diode array comprising a plurality of stacked linear laser diode arrays;

first and second electrodes, electrically connected to said two-dimensional laser diode array, for supplying electrical energy thereto such that at least one of said linear laser diode arrays emits a laser output from an emitting facet thereof; and a plurality of heatsinks wherein at least one heatsink is disposed between and electrically connects each adjacent pair of said plurality of linear laser diode arrays, said plurality of heatsinks extending rearwardly from said two-dimensional laser diode array to define a plurality of channels between said rearwardly extending heatsinks, said channels being adapted to receive liquid coolant such that the liquid coolant directly contacts and cools said plurality of linear laser diode arrays while maintaining electrical isolation between said first and second electrodes.

17. An immersion cooled laser diode array according to claim 16 further comprising:

a housing in which said two-dimensional laser diode array, said first and second electrodes and said plurality of heatsinks are disposed, said housing having a front surface having an opening defined therein; and a window disposed within the opening defined in the front surface of said housing, said two-dimensional laser diode array being disposed within said housing such that the respective emitting facets of said plurality of linear laser diode arrays are positioned adjacent said window in a predetermined spaced apart relationship such that liquid coolant flows between said window and said plurality of linear laser diode arrays to thereby cool said laser diode array.

18. An immersion cooled laser diode array according to claim 17 wherein said housing further defines an inlet port and an outlet port through which liquid coolant flows.

19. An immersion cooled semiconductor laser device according to claim 18 further comprising heat exchanger means, connected between said outlet port and said inlet port of said housing, for discharging heat from the liquid coolant.

20. An immersion cooled laser diode array according to claim 16 further comprising:

a housing in which said two-dimensional laser diode array, said first and second electrodes and said plurality of heatsinks are disposed, said housing having a front surface having an opening defined therein; and a solid state laser disposed within the opening defined in the front surface of said housing, said two-dimensional laser diode array being disposed within said housing such that the respective emitting facets of said plurality of linear laser diode arrays are positioned adjacent said solid state laser in a predetermined spaced apart and aligned relationship such that said laser diode array pumps said solid state laser and such that liquid coolant flows between said solid state laser and said plurality of linear laser diode arrays to thereby cool both said solid state laser and said laser diode array.

21. An immersion cooled laser diode array according to claim 16 wherein each heatsink extends from a first end between a pair of adjacent linear laser diode arrays rearwardly to a second end, the immersion cooled laser diode array further comprising a plurality of electrically insulating spacers, at least one of said electrically insulating spacers disposed between the respective second ends of each pair of adjacent heatsinks to further define a channel between a pair of adjacent heatsinks, said electrically insulating spacer disposed therebetween and said linear laser diode array disposed therebetween.

22. An immersion cooled laser diode array according to claim 16 wherein each linear laser diode array has first and second opposed major surfaces, said plurality of linear laser diode arrays being stacked such that the first major surface of a first linear laser diode array faces the second major surface of a second linear laser diode array to thereby create a two-dimensional laser diode array.

23. An immersion cooled laser diode array according to claim 22 wherein each heatsink is positioned between the first major surface of a first linear laser diode array and the second major surface of a second linear laser diode array so as to be in thermal contact therewith such that the heatsink absorbs heat generated by said plurality of linear laser diode arrays during the emission of a laser output by said laser diode array.

24. A method of cooling a semiconductor laser device comprising the steps of:

electrically activating the semiconductor laser device such that said semiconductor laser device emits a laser output through an emitting facet thereof;

generating heat within the semiconductor laser device during the emission of the laser output so as to thereby increase the temperature of the semiconductor laser device; and circulating liquid coolant about the electrically activated semiconductor laser device such that the liquid coolant directly contacts the emitting facet of the semiconductor laser device, wherein the liquid coolant has a temperature less than the temperature of the semiconductor laser device during the emission of the laser output such that said step of circulating liquid coolant about the semiconductor laser device cools the semiconductor laser device.

25. A method according to claim 24 wherein said electrically activating step comprises the step of supplying electrical energy to the semiconductor laser diode with first and second electrodes, and wherein said circulating step comprises the step of maintaining electrical isolation between the first and second electrodes with the liquid coolant circulating about the semiconductor laser device.

26. A method according to claim 25 wherein the semiconductor laser device and the first and second electrodes are disposed in a housing, the housing having a front surface defining an opening therein in which a window is disposed, wherein the semiconductor laser device is disposed within the housing such that the emitting facet of the semiconductor laser device is positioned adjacent the window in a predetermined spaced apart relationship, and wherein said circulating step comprises the step of flowing liquid coolant flows between the window and the semiconductor laser device to thereby cool the semiconductor laser device.

27. A method according to claim 24 wherein said circulating step comprises the step of directing the liquid coolant in a direction perpendicular to the emitting facet of the semiconductor laser device.

28. A method according to claim 24 wherein the semiconductor laser device includes a two-dimensional laser diode array comprising a plurality of stacked linear laser diode arrays, the semiconductor laser device further including a plurality of heatsinks wherein at least one heatsink is disposed between and electrically connects each adjacent pair of the plurality of linear laser diode arrays, the plurality of heatsinks extending rearwardly from the two-dimensional laser diode array to define a plurality of channels between the rearwardly extending heatsinks, and wherein said circulating step comprises the step of circulating liquid coolant through the channels such that the liquid coolant directly contacts and cools the plurality of linear laser diode arrays.

29. A method according to claim 28 wherein said step of circulating liquid coolant through the channels defined between the plurality of rearwardly extending heatsinks includes the step of creating a laminar coolant flow through the channels.

30. A method according to claim 28 wherein said step of circulating liquid coolant through the channels defined between the plurality of rearwardly extending heatsinks includes the step of creating a turbulent coolant flow through the channels.

31. A method according to claim 24 further comprising the step of discharging heat from the liquid coolant following said flowing step such semiconductor laser device to thereby further cool the semiconductor laser device.

* * * * *